US012662590B2

(12) United States Patent
Koseki et al.

(10) Patent No.: US 12,662,590 B2
(45) Date of Patent: Jun. 23, 2026

(54) METHOD FOR USING A BUFFER SHEET

(71) Applicant: SHOWA DENKO MATERIALS CO., LTD., Chiyodu-ku (JP)

(72) Inventors: Yuta Koseki, Chiyoda-ku (JP); Daisuke Fujimoto, Chiyoda-ku (JP); Kumpei Yamada, Chiyoda-ku (JP); Naoya Suzuki, Chiyodu-ku (JP); Hitoshi Onozeki, Chiyoda-ku (JP); Hiroshi Takahashi, Chiyoda-ku (JP)

(73) Assignee: RESONAC CORPORATION, Tokyo (JP)

( * ) Notice: Subject to any disclaimer, the term of this patent is extended or adjusted under 35 U.S.C. 154(b) by 701 days.

(21) Appl. No.: 18/052,536

(22) Filed: Nov. 3, 2022

(65) Prior Publication Data

US 2023/0095879 A1     Mar. 30, 2023

Related U.S. Application Data

(62) Division of application No. 15/755,869, filed as application No. PCT/JP2016/075002 on Aug. 26, 2016, now abandoned.

(30) Foreign Application Priority Data

Aug. 28, 2015     (JP) ................................. 2015-169048

(51) Int. Cl.
| | |
|---|---|
| *H10W 95/00* | (2026.01) |
| *B32B 37/00* | (2006.01) |
| *C08L 21/00* | (2006.01) |
| *H10W 72/20* | (2026.01) |
| *H10W 74/00* | (2026.01) |
| *H10W 72/00* | (2026.01) |
| *H10W 74/15* | (2026.01) |

(52) U.S. Cl.
CPC ....... *C08L 21/00* (2013.01); *H10W 72/01333* (2026.01); *H10W 72/01336* (2026.01); *H10W 72/0198* (2026.01); *H10W 72/0711* (2026.01); *H10W 72/07141* (2026.01); *H10W 72/072* (2026.01); *H10W 72/07232* (2026.01); *H10W 72/073* (2026.01); *H10W 72/07304* (2026.01); *H10W 72/07331* (2026.01); *H10W 72/07332* (2026.01); *H10W 72/222* (2026.01); *H10W 72/241* (2026.01); *H10W 72/252* (2026.01); *H10W 74/15* (2026.01)

(58) Field of Classification Search
None
See application file for complete search history.

(56) References Cited

U.S. PATENT DOCUMENTS

| | | | |
|---|---|---|---|
| 3,890,282 A | 6/1975 | Heilman | |
| 4,652,398 A | 3/1987 | Goswami et al. | |
| 6,042,682 A | * 3/2000 | Funaya | H01L 21/563 |
| | | | 257/E21.503 |
| 6,358,660 B1 | * 3/2002 | Agler | D06P 5/007 |
| | | | 430/125.33 |
| 6,919,223 B2 | 7/2005 | Osada | |
| 8,915,418 B2 | 12/2014 | Shiratori et al. | |
| 2002/0119298 A1 | 8/2002 | Sugawa et al. | |
| 2003/0235938 A1 | 12/2003 | Osada | |
| 2006/0278981 A1 | 12/2006 | Trezza et al. | |
| 2007/0007698 A1 | 1/2007 | Sano | |
| 2007/0241436 A1 | 10/2007 | Ookubo et al. | |
| 2010/0178501 A1 | 7/2010 | Masuko et al. | |
| 2014/0106106 A1 | 4/2014 | Shishido et al. | |
| 2014/0242757 A1 | 8/2014 | Yoko et al. | |
| 2015/0037589 A1 | 2/2015 | Inoue et al. | |
| 2016/0190094 A1 | 6/2016 | Yoko et al. | |
| 2016/0237288 A1 | * 8/2016 | Shiga | C09J 11/06 |

FOREIGN PATENT DOCUMENTS

| | | | |
|---|---|---|---|
| JP | H11-087777 A | | 3/1999 |
| JP | 2002-060445 A | | 2/2002 |
| JP | 2003124603 A | * | 4/2003 |
| JP | 2004031510 A | | 1/2004 |
| JP | 2004-273669 A | | 9/2004 |
| JP | 2006-274248 A | | 10/2006 |
| JP | 2007-001302 A | | 1/2007 |
| JP | 2007095779 A | | 4/2007 |
| JP | 2008193023 A | | 8/2008 |
| JP | 2008-547205 A | | 12/2008 |
| JP | 2012-084582 A | | 4/2012 |
| JP | 2012174722 A | | 9/2012 |
| JP | 2013-197111 A | | 9/2013 |
| JP | 2013-219285 A | | 10/2013 |
| JP | 2014-033197 A | | 2/2014 |
| JP | 2014-060241 A | | 4/2014 |
| JP | 2014-131016 A | | 7/2014 |
| JP | 2014-179419 A | | 9/2014 |
| JP | 2015-170690 A | | 9/2015 |
| KR | 10-2008-0031183 A | | 4/2008 |
| KR | 10-2008-0075031 A | | 8/2008 |
| KR | 10-2012-0032402 A | | 4/2012 |
| TW | 201428032 A | | 7/2014 |
| WO | 2004/086493 A1 | | 10/2004 |
| WO | 2006/129520 A1 | | 12/2006 |
| WO | 2012/133760 A1 | | 10/2012 |
| WO | 2013/133015 A1 | | 9/2013 |

OTHER PUBLICATIONS

Machine translation of JP-2003124603-A (no date).*

* cited by examiner

*Primary Examiner* — Michael J Feely

(74) *Attorney, Agent, or Firm* — SOLARIS Intellectual Property Group, PLLC

(57) ABSTRACT

The present invention provides a buffer sheet composition including a thermosetting compound, which buffer sheet composition is used for producing a buffer sheet to be interposed between a heating member and an electronic component, when the electronic component is heated by the heating member so as to mount the electronic component on a substrate, as well as a buffer sheet including a thermosetting composition layer obtained by forming the buffer sheet composition into the form of a sheet.

11 Claims, 3 Drawing Sheets

METHOD FOR USING A BUFFER SHEET

CROSS-REFERENCE TO RELATED APPLICATIONS

This application is a divisional application of, and claims priority to, U.S. patent application Ser. No. 15/755,869, filed Feb. 27, 2018, which is a National Phase Application in the United States of International Application No. PCT/JP2016/075002, filed Aug. 26, 2016. Further, this application claims priority from Japanese Patent Application No. 2015-169048, filed Aug. 28, 2015. The disclosures of all the applications listed above are incorporated herein by reference in their entireties.

BACKGROUND

Technical Field

The present disclosure relates to a buffer sheet composition and a buffer sheet.

Related Art

Electronic components such as semiconductor devices are generally placed in packages in order to protect the devices from external environment to secure various reliabilities, and to facilitate the mounting of the devices to substrates. There are various types of packages, and packages in which a low pressure transfer molding method is used for sealing electronic components are widely used. This type of package is produced by fixing an electronic component to tabs formed on a metal lead frame, electrically connecting an electrode on a surface of the electronic component and inner leads with gold wires, and then sealing the electronic component, the gold wires, and a part of the lead frame with an epoxy resin composition.

Such resin-sealed packages have a larger outer size relative to the size of the electronic component included therein. Therefore, package forms are shifting from a pin insertion type to a surface mounting type from the viewpoint of high-density packaging, and efforts for achieving a reduction in size and thickness of the packages have been actively made. However, there are limits to achieve an improvement in mounting efficiency, as long as the packages have a structure in which an electronic component is mounted on a metal lead frame, and the wire-bonded electronic component is sealed with a resin.

In view of this, the use of flip chip mounting is increasing, in recent years, as a method of mounting an electronic component on a substrate for packaging. The flip chip mounting has, in addition to excellent mounting efficiency, excellent electrical properties and capability to support increased number of pins. In the flip chip mounting, a bare chip on the surface of which bumps are formed is mounted face down on a substrate, with the bumps being interposed therebetween.

For example, in the field of COB (Chip on Board), hybrid IC (Integrated Circuit), modules, cards, and the like, the flip chip mounting has been used to realize the high-density packaging of some of the electronic components. In recent years, various types of small packages referred to as CSPs (Chip Scale Packages) have been developed, which employ flip chip mounting, to meet demands for higher integration, higher functionalization, pin-multiplication, systematization, an increase in speed, a reduction in cost, and the like of electronic components. The flip chip mounting is also employed in recently developed surface mounting type packages in which terminals are arranged in the form of an area allay.

In the case of carrying out the flip chip mounting, ensuring connection reliability is an important issue, because an electronic component and a substrate have a different thermal expansion coefficient, and thus, a thermal stress is generated at a joint portion thereof due to heating. Further, it is also an important issue to ensure moisture resistance reliability, because the surface of a bare chip on which a circuit is formed is not sufficiently protected, and thus susceptible to infiltration of water and ionic impurities. As a countermeasure for these problems, a technique has been commonly used, in which an underfill material is interposed in a gap between the electronic component and the substrate, and the underfill material is cured by heating or the like to reinforce the joint portion and to protect the semiconductor device.

There are various types of methods for allowing an underfill material to be interposed in a gap between an electronic component and a substrate, such as, for example, post-insertion methods and pre-application methods. In particular, as CSPs are increasingly becoming smaller and thinner, a method is drawing attention in which a pre-applicable underfill material is used in order to reinforce the joining between an electronic component and a substrate, and the joint portion thereof (see, for example, Patent Document 1).

As the mounting method using a pre-applicable underfill material, a TCB (Thermal Compression Bonding) process is known. Currently, in the TCB process, there is a case in which a thermoplastic anti-fouling sheet is used, in order to prevent the pre-applied underfill material from seeping out during the mounting to cause fouling of a head (heating member).

RELATED ART DOCUMENT

Patent Document

Patent Document 1: Japanese Patent Application Laid-Open (JP-A) No. 2013-219285

SUMMARY

Technical Problem

The mounting method using the above described pre-applicable underfill material usually employs an approach in which each electronic component is separately mounted on a substrate. As a result, the method is associated with problems of low productivity and an increase in production cost. In view of this, a technique has been examined, in recent years, in which a plurality of electronic components are collectively mounted on substrates, by multi-staging, and increasing the size of, the head.

In a case in which a plurality of electronic components are collectively mounted on substrates, variation may occur in a state of contact between the head and the electronic components due to deformation of the head, warpage of a base material of the substrate, or the like, to cause an uneven load distribution during the mounting, which becomes a problem. Such an uneven load distribution is thought to have the following influences. First, the uneven load distribution is thought to cause a difference between the loads applied to the respective electronic components. In this case, some of the electronic components may potentially fail to be joined to the substrates due to insufficient load being applied thereto, and further, some of the electronic components may possibly break due to an excessive load being applied thereto. In addition, it is thought that the positions of the electronic components may be deviated in a surface direction, due to the uneven load distribution. In a case in which the positions of bumps on the electronic components are significantly deviated from the positions of pads on the substrates, the bumps may not be disposed at desired connection sites, possibly resulting in a failure to achieve conduction.

As described above, there is a case in which a thermoplastic film is used as an anti-fouling sheet in the TCB process. However, it has been difficult to reduce the uneven load distribution, even in a case in which a thermoplastic anti-fouling sheet is used when collectively mounting a plurality of electronic components on substrates.

The present invention has been made in view of the above described situation, and an object of the present invention is to provide a buffer sheet which is capable of reducing a positional deviation between an electronic component and a substrate, and which is suitably used when collectively producing a plurality of electronic component devices, as well as to provide a buffer sheet composition used for producing the buffer sheet.

Solution to Problem

Specific means for solving the above described problems include the following embodiments.

<1> A buffer sheet composition including a thermosetting compound,
in which the buffer sheet composition is used for producing a buffer sheet to be interposed between a heating member and an electronic component t in a case in which the electronic component is heated by the heating member so as to mount the electronic component on a substrate.

<2> The buffer sheet composition according to <1>, further including a polymerization initiator.

<3> The buffer sheet composition according to <1> or <2>, further including a curing agent.

<4> The buffer sheet composition according to any one of <1> to <3>, further including a solvent.

<5> A buffer sheet including a thermosetting composition layer obtained by forming the buffer sheet composition according to any one of <1> to <4> into a sheet.

<6> The buffer sheet according to <5>, including a support on one surface or both surfaces of the buffer sheet.

<7> The buffer sheet according to <5> or <6>, in which the composition layer has an average thickness of 20 μm or more.

Advantageous Effects of Invention

According to the present disclosure, it is possible to provide a buffer sheet which is capable of reducing the positional deviation between an electronic component and a substrate, and which is suitably used when collectively producing a plurality of electronic component devices, as well as a buffer sheet composition used for producing the buffer sheet.

DETAILED DESCRIPTION

Figure 1A:
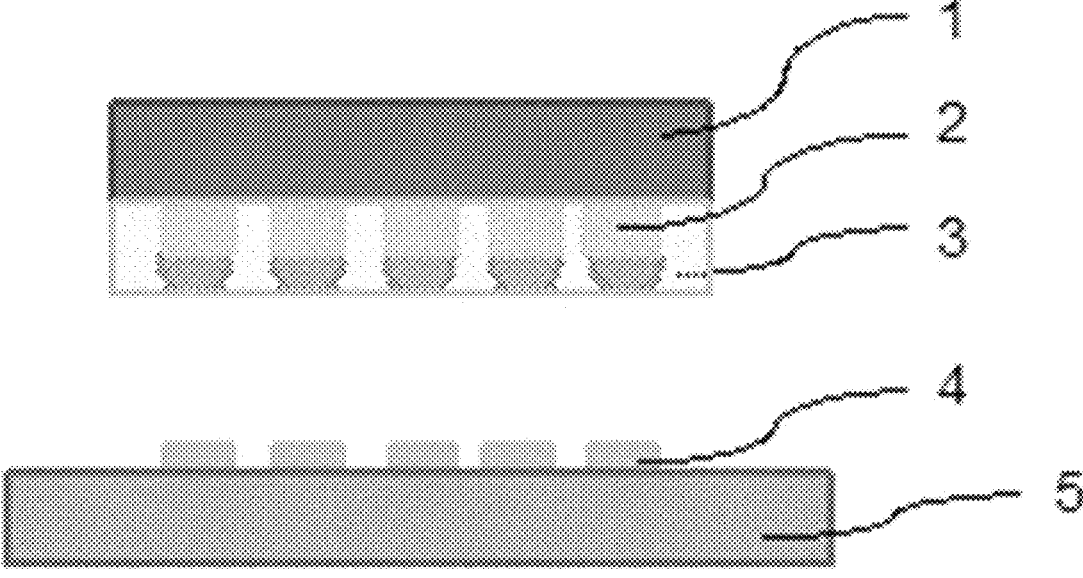
FIG. 1A is a schematic diagram illustrating a production process of a method of producing an electronic component device in an present embodiment.

Preferable Embodiments in the present invention will be described below. However, the present invention is not limited to the following embodiments. In the following embodiments, their constituents (also including constituent processes) are not necessarily essential unless otherwise clearly indicated. This is true for numerical values and ranges and does not unfairly limit the present invention.

In the present specification, each numerical range specified using "(from) . . . to . . . " represents a range including the numerical values noted before and after "to" as the minimum value and the maximum value, respectively.

In the present specification, with respect to numerical ranges stated hierarchically herein, the upper limit or the lower limit of a numerical range of a hierarchical level may be replaced with the upper limit or the lower limit of a numerical range of another hierarchical level. Further, in the present specification, with respect to a numerical range, the upper limit or the lower limit of the numerical range may be replaced with a relevant value shown in any of Examples.

In the present specification, in referring herein to a content of a component in a composition, when plural kinds of substances exist corresponding to a component in the composition, the content means, unless otherwise specified, the total amount of the plural kinds of substances existing in the composition.

In the present specification, in referring herein to a particle diameter of a component in a composition, when plural kinds of particles exist corresponding to a component in the composition, the particle diameter means, unless otherwise specified, a value with respect to the mixture of the plural kinds of particles existing in the composition.

In the present specification, the term "layer" comprehends herein not only a case in which the layer is formed over the whole observed region where the layer is present, but also a case in which the layer is formed only on part of the region.

In the present specification, the term "average thickness" and "average width" mean an arithmetic mean value of 3 point measurement value at an arbitrary portion.

In the present specification, the term "process" denotes not only independent processes but also processes that cannot be clearly distinguished from other processes as long as a purpose is accomplished by the process.

<Buffer Sheet Composition>

A buffer sheet composition in the present embodiment contains a thermosetting compound, and is used for producing a buffer sheet to be interposed between a heating member and an electronic component t in a case in which the electronic component is heated by the heating member so as to mount the electronic component on a substrate. The buffer sheet composition may further include another component(s) such as a polymerization initiator, a curing agent, a thermoplastic resin, an inorganic filler, a curing accelerator, and/or a solvent.

By interposing the buffer sheet produced using the buffer sheet composition in the present embodiment between the heating member and the electronic component, when the electronic component is heated by the heating member so as to mount the electronic component on the substrate, it becomes possible to reduce the positional deviation between the electronic component and the substrate, and to collectively produce a plurality of electronic component devices. The reason for this can be considered as follows, for example.

When the buffer sheet is interposed between the heating member and the electronic component, the buffer sheet is cured to reduce a thermal expansion of the heating member and the electronic component, and as a result of which the positional deviation resulting from a difference in the thermal expansion is reduced. Further, in a case in which a plurality of electronic component devices are collectively produced, for example, the buffer sheet can fill the gaps formed between the heating member and the electronic components, even when there is a variation in the state of contact between the heating member and the respective electronic components. As a result of the buffer sheet being cured in that state, the uneven load distribution is reduced, thereby reducing the positional deviation.

Respective components contained in the buffer sheet composition in the present embodiment will now be described in detail below.

(Thermosetting Compound)

The buffer sheet composition in the present embodiment contains at least one thermosetting compound. Examples of the thermosetting compound include (meth)acrylate compounds, epoxy resins, bismaleimide compounds, cyanate compounds, and phenol compounds. Among these, at least one kind selected from the group consisting of (meth)acrylate compounds, epoxy resins, bismaleimide compounds, and phenol compounds is preferred, and at least one kind selected from the group consisting of (meth)acrylate compounds, epoxy resins, and bismaleimide compounds is more preferred, from the viewpoint of viscosity of the buffer sheet composition and the thermal expansion coefficient of a cured product of the buffer sheet composition. From the viewpoint of curing rate, at least one kind selected from the group consisting of (meth)acrylate compounds and epoxy resins are still more preferred. These thermosetting compounds can be used singly, or in combination of two or more kinds thereof.

In the present specification, the term "(meth)acrylate" refers to acrylate or methacrylate.

In a case in which the buffer sheet composition contains a (meth)acrylate compound as the thermosetting compound, the (meth)acrylate compound is not particularly limited, and can be selected as appropriate from commonly used (meth) acrylate compounds. The (meth)acrylate compound may be a monofunctional (meth)acrylate compound, or a bifunctional or higher (meth)acrylate compound. Examples of the (meth)acrylate compound include erythritol-type poly (meth)acrylate compounds, glycidyl ether-type (meth)acrylate compounds, bisphenol A-type di(meth)acrylate compounds, cyclodecane-type di(meth)acrylate compounds, methylol-type (meth)acrylate compounds, dioxane-type di(meth)acrylate compounds, bisphenol F-type (meth)acrylate compounds, dimethylol-type (meth)acrylate compounds, isocyanuric acid-type di(meth)acrylate compounds, and trimethylol-type tri(meth)acrylate compounds. Among these, at least one kind selected from the group consisting of trimethylol-type tri(meth)acrylate compounds, isocyanuric acid-type di(meth)acrylate compounds, bisphenol F-type (meth)acrylate compounds, cyclodecane-type di(meth)acrylate compounds, and glycidyl ether-type (meth)acrylate compounds is preferred. These (meth)acrylate compounds can be used singly, or in combination of two or more kinds thereof.

In a case in which the buffer sheet composition contains an epoxy resin as the thermosetting compound, the epoxy resin is not particularly limited as long as the epoxy resin contains two or more epoxy groups within one molecule, and it is possible to use any epoxy resin commonly used in an epoxy resin composition for use in electronic components. The epoxy resin may be solid or liquid, and a solid epoxy resin and a liquid epoxy resin may also be used in combination. Examples of the epoxy resin include: glycidyl ether-type epoxy resins obtained by allowing a compound such as bisphenol A, bisphenol F, bisphenol AD, bisphenol S, naphthalene diol, or hydrogenated bisphenol A to react with epichlorohydrin; novolac type epoxy resins such as orthocresol novolac type epoxy resins, which are obtained by condensing or copolymerizing a phenol compound with an aldehyde compound to obtain a novolac resin, and epoxidizing the resulting novolac resin; glycidyl ester-type epoxy resins obtained by allowing a polybasic acid such as phthalic acid or a dimer acid to react with epichlorohydrin; glycidyl amine-type epoxy resins obtained by allowing an amine compound such as p-aminophenol, diaminodiphenylmethane, or isocyanuric acid to react with epichlorohydrin; linear aliphatic epoxy resins obtained by oxidizing an olefin bond with a peracid such as peracetic acid; and alicyclic epoxy resins. These epoxy resins can be used singly, or in combination of two or more kinds thereof. A liquid epoxy resin is preferred from the viewpoint of reducing the viscosity of the buffer sheet composition, and a bisphenol-type epoxy resin and a glycidyl amine-type epoxy resin are preferred from the viewpoint of reactivity and heat resistance.

A content of the thermosetting compound in the buffer sheet composition is not particularly limited. From the viewpoint of obtaining sufficient curability, the content of the thermosetting compound is preferably, for example, 30% by mass or more, and more preferably 40% by mass or more, with respect to a total amount of the buffer sheet composition. From the viewpoint of fluidity of the buffer sheet composition, the content of the thermosetting compound is preferably, for example, 70% by mass or less, and more preferably 60% by mass or less, with respect to the total amount of the buffer sheet composition.

(Polymerization Initiator)

In a case in which the buffer sheet composition contains a (meth)acrylate compound as the thermosetting compound, the buffer sheet composition preferably contains a polymerization initiator. Examples of the polymerization initiator include thermal polymerization initiators and photopolymerization initiators.

In a case in which the buffer sheet composition contains a thermal polymerization initiator as the polymerization initiator, the thermal polymerization initiator is not particularly limited, and may be, for example, a radical polymerization initiator. Examples of the radical polymerization initiator include ketone peroxides, hydroperoxides, diacyl peroxides, dialkyl peroxides, peroxyketals, alkyl peresters (peroxyesters), and peroxycarbonates. These radical polymerization initiators can be used singly, or in combination of two or more kinds thereof.

Specific examples of the ketone peroxides include methyl ethyl ketone peroxide, methyl isobutyl ketone peroxide, acetylacetone peroxide, cyclohexanone peroxide, and methylcyclohexanone peroxide.

Specific examples of the hydroperoxides include 1,1,3,3-tetramethylbutyl hydroperoxide, cumene hydroperoxide, t-butyl hydroperoxide, p-menthane hydroperoxide, and diisopropylbenzene hydroperoxide.

Specific examples of the diacyl peroxides include, diisobutyryl peroxide, bis-3,5,5-trimethylhexanol peroxide, dilauroyl peroxide, dibenzoyl peroxide, m-toluyl benzoyl peroxide, and succinic acid peroxide.

Specific examples of the dialkyl peroxides include dicumyl peroxide, 2,5-dimethyl-2,5-bis(t-butylperoxy) hexane, 1,3-bis(t-butylperoxyisopropyl)hexane, t-butyl-cumyl peroxide, di-t-butyl peroxide, di-t-hexyl peroxide, and 2,5-dimethyl-2,5-bis(t-butylperoxy)hexyne-3.

Specific examples of the peroxyketals include 1,1-bis(t-hexylperoxy)-3,3,5-trimethylcyclohexane, 1,1-bis(t-hexylper-oxy)cyclohexane, 1,1-bis(t-butylperoxy)-2-methylcyclo-hexane, 1,1-bis(t-butylperoxy)cyclohexane, 2,2-bis(t-butylperoxy)butane, and 4,4-bis(t-butylperoxy)pentanoic acid butyl.

Specific examples of the alkyl peresters (peroxyesters) include 1,1,3,3-tetramethylbutyl peroxyneodecanoate, α-cumyl peroxyneodecanoate, t-butyl peroxyneodecanoate, t-hexyl peroxyneodecanoate, t-butyl peroxyneoheptanoate, t-hexyl peroxypivalate, t-butyl peroxypivalate, 1,1,3,3-te-tramethylbutyl peroxy-2-ethylhexanoate, t-amyl peroxy-2-ethylhexanoate, t-butyl peroxy-2-ethylhexanoate, t-butyl peroxyisobutyrate, di-t-butyl peroxyhexahydroterephtha-late, 1,1,3,3-tetramethylbutyl peroxy-3,5,5-trimethyl-hexanoate, t-amyl peroxy 3,5,5-trimethylhexanoate, t-butyl peroxy-3,5,5-trimethylhexanoate, t-butyl peroxyacetate, t-butyl peroxybenzoate, dibutyl peroxytrimethyladipate, 2,5-dimethyl-2,5-di-2-ethylhexanoylperoxyhexane, t-hexyl peroxy-2-ethylhexanoate, t-hexyl peroxyisopropyl mono-carbonate, t-butyl peroxylaurate, t-butyl peroxyisopropyl monocarbonate, t-butyl peroxy-2-ethylhexyl monocarbon-ate and 2,5-dimethyl-2,5-di-benzoylperoxyhexane.

Specific examples of the peroxycarbonates include di-n-propyl peroxydicarbonate, diisopropyl peroxycarbonate, di-4-t-butylcyclohexyl peroxycarbonate, di-2-ethylhexyl peroxycarbonate, di-sec-butyl peroxycarbonate, di-3-methoxybutyl peroxydicarbonate, di-2-ethylhexyl per-oxydicarbonate, diisopropyloxy dicarbonate, t-amyl peroxy-isopropyl carbonate, t-butyl peroxyisopropyl carbonate, t-butyl peroxy-2-ethylhexyl carbonate and 1,6-bis(t-butylp-eroxycarboxyoxy)hexane.

Among these radical polymerization initiators, a cyclo-hexane-type peroxide such as 1,1-bis(t-butylperoxy)cyclo-hexane is preferred from the viewpoint of curability.

In a case in which the buffer sheet composition contains the thermal polymerization initiator, a content of the thermal polymerization initiator is preferably, for example, from 0.01 parts by mass to 10 parts by mass, and more preferably from 0.1 parts by mass to 5 parts by mass with respect to 100 parts by mass of a total amount of the (meth)acrylate compound.

In a case in which the buffer sheet composition contains a photopolymerization initiator as the polymerization initia-tor, the photopolymerization initiator is not particularly limited, and examples thereof include a compound having an alkylphenone structure within the molecule, a compound having an oxime ester structure within the molecule, and a compound having a phosphorus element within the mol-ecule. These photopolymerization initiators can be used singly, or in combination of two or more kinds thereof. A sensitizer may also be used in combination, if necessary.

Specific examples of the compound having an alkylphe-none structure within the molecule include 2,2-dimethoxy-1,2-diphenylethan-1-one, 1-hydroxy-cyclohexyl-phenyl-ke-tone, 2-hydroxy-2-methyl-1-phenyl-propan-1-one, 1-[4-(2-hydroxyethoxy)-phenyl]-2-hydroxy-2-methyl-1-propan-1-one, 2-hydroxy-1-{4-[4-(2-hydroxy-2-methyl-propionyl)- benzyl]phenyl}-2-methyl-propan-1-one, 2-methyl-1-(4-methylthiophenyl)-2-morpholinopropan-1-one, 2-benzyl-2-dimethylamino-1-(4-morpholinophenyl)-butanone-1, and 2-(dimethylamino)-2-[(4-methylphenyl)methyl]-1-[4-(4-morpholinyl)phenyl]-1-butanone.

Examples of commercially available products of the com-pound having an alkylphenone structure within the molecule include IRGACURE 651, IRGACURE 184, IRGACURE 1173, IRGACURE 2959, IRGACURE 127, IRGACURE 907, IRGACURE 369E, and IRGACURE 379EG (all of the above manufactured by BASF Japan Ltd.).

Specific examples of the compound having an oxime ester structure within the molecule include 1,2-octanedione 1-[4-(phenylthio)-2-(O-benzoyloxime)], ethanone 1-[9-ethyl-6-(2-methylbenzoyl)-9H-carbazol-3-yl]-1-(O-acetyloxime), and ethanone 1-[9-ethyl-6-(2-methyl-4-(2-(1,3-dioxso-2-di-methyl-cyclopent-5-yl)ethoxy)-benzoyl)-9H-carbazolyl-3-yl]-1-(O-acetyloxime).

Examples of commercially available products of the com-pound having an oxime ester structure within the molecule include: IRGACURE OXE01 and IRGACURE OXE02 (both manufactured by BASF Japan Ltd.); and N-1919 (manufactured by ADEKA Corporation).

Specific examples of the compound having a phosphorus element within the structure include bis(2,4,6-trimethylben-zoyl)-phenylphosphine oxide and 2,4,6-trimethylbenzoyl-diphenyl-phosphine oxide.

Examples of commercially available products of the com-pound having a phosphorus element within the structure include IRGACURE 819 and IRGACURE TPO (both manufactured by BASF Japan Ltd.).

In a case in which the buffer sheet composition contains the photopolymerization initiator, a content of the photopo-lymerization initiator is preferably, for example, from 0.01 parts by mass to 3 parts by mass, and more preferably from 0.1 parts by mass to 0.5 parts by mass, with respect to 100 parts by mass of the total amount of the (meth)acrylate compound. When the content of the photopolymerization initiator is 0.01 parts by mass or more, there is a tendency that a reaction rate due to light irradiation is increased, thereby facilitating the formation of the sheet. When the content of the photopolymerization initiator is 3 parts by mass or less, on the other hand, there is a tendency that an excessive increase in the reaction rate due to light irradiation is prevented, and thus the reactivity during thermal curing becomes sufficient.

(Curing Agent)

In a case in which the buffer sheet composition contains an epoxy resin as the thermosetting compound, the buffer sheet composition preferably contains a curing agent. The curing agent is not particularly limited, and can be selected from commonly used curing agents. The curing agent may be solid or liquid, and a solid curing agent and a liquid curing agent may be used in combination. It is preferable to use at least one acid anhydride as the curing agent, from the viewpoint of allowing the composition to be cured within a short period of time.

A ratio of a number of equivalent of epoxy groups in the epoxy resin, to a number of equivalent of functional groups in the curing agent which react with the epoxy groups, is not particularly limited. From the viewpoint of reducing the amount of each component which is left unreacted, it is preferable to adjust the ratio such that an amount of func-tional groups in the curing agent is from 0.1 equivalents to 2.0 equivalents, more preferably from 0.5 equivalents to 1.25 equivalents, and still more preferably from 0.8 equivalents to 1.2 equivalents, with respect to 1 equivalent of epoxy groups in the epoxy resin.

(Thermoplastic Resin)

The buffer sheet composition in the present embodiment may contain at least one thermoplastic resin. Examples of the thermoplastic resin include acrylic resins, styrene resins, butadiene resins, imide resins, and amide resins. These thermoplastic resins can be used singly, or in combination of two or more kinds thereof.

The thermoplastic resin can be produced, for example, by radical polymerization of a polymerizable monomer. Examples of the polymerizable monomer include: (meth) acrylic acid; (meth)acrylic acid esters such as methyl (meth) acrylate, ethyl (meth)acrylate, and benzyl (meth)acrylate; (meth)acrylamides such as diacetone (meth)acrylamide; styrene and styrene derivatives such as styrene, vinyl toluene, and α-methylstyrene; ethers of vinyl alcohol such as vinyl-n-butyl ether; maleic acid; maleic acid monoesters such as monomethyl maleate and monoethyl maleate; fumaric acid; cinnamic acid; itaconic acid; and crotonic acid. These polymerizable monomers can be used singly, or in combination of two or more kinds thereof.

In the present specification, the term "(meth)acrylic acid" refers to acrylic acid or methacrylic acid; and the term "(meth)acrylamide" refers to acrylamide or methacrylamide.

The thermoplastic resin preferably has a weight average molecular weight of, for example, from 5,000 to 1,000,000, and more preferably from 20,000 to 500,000, from the viewpoint of film forming properties and fluidity.

The weight average molecular weight as used in the present specification is a value measured by a gel permeation chromatography (GPC) method and converted using a calibration curve prepared with standard polystyrene. Conditions for GPC are shown below.

Pump: Model L-6000 (trade name; manufactured by Hitachi Ltd.)
  Columns: GELPACK GL-R420+GELPACK GL-R430+ GELPACK GL-R440 (3 columns in total) (trade name; manufactured by Hitachi Chemical Co., Ltd.)
  Eluent: tetrahydrofuran (THF)
  Measurement temperature: 40° C.
  Flow rate: 2.05 mL/min
  Detector: Model L-3300 RI (trade name; manufactured by Hitachi Ltd.)

In a case in which the buffer sheet composition contains the thermoplastic resin, a content of the thermoplastic resin is preferably, for example, from 1% by mass to 70% by mass, and more preferably from 5% by mass to 50% by mass, with respect to the total amount of the buffer sheet composition. When the content of the thermoplastic resin is 1% by mass or more, the film forming properties tends to improve. When the content of the thermoplastic resin is 70% by mass or less, the curability tends to improve, thereby improving joinability between the electronic component and the substrate.

(Inorganic Filler)

The buffer sheet composition in the present embodiment may contain at least one inorganic filler. Examples of the inorganic filler include silica particles such as fused silica and crystalline silica; particles of calcium carbonate, clay, alumina or the like; particles of silicon nitride, silicon carbide, boron nitride, calcium silicate, potassium titanate, aluminum nitride, beryllia, zirconia, zircon, fosterite, steatite, spinel, mullite, titania or the like; beads obtained by spheroidizing these particles; and glass fibers. These inorganic fillers can be used singly, or in combination of two or more kinds thereof.

The inorganic filler preferably has a volume average particle size of, for example, within the range of from 0.01 μm to 20 μm, and more preferably within the range of from 0.3 μm to 10 μm. When the volume average particle size of the inorganic filler is 0.01 μm or more, there is a tendency that a viscosity of the buffer sheet composition can be easily adjusted by controlling the amount of the inorganic filler to be added. When the volume average particle size of the inorganic filler is 20 μm or less, there is a tendency that the curability of the composition can be adjusted to control an elastic modulus of the resulting cured product, without compromising an ability of the resulting buffer film to conform to irregular surfaces.

In the present specification, the term "volume average particle size" refers to a particle size at a cumulative volume of 50% (D50) in a volume cumulative distribution curve, which is drawn using a laser diffraction particle size distribution measuring apparatus, from the small diameter side.

In a case in which the buffer sheet composition contains the inorganic filler, a content of the inorganic filler is preferably, for example, from 5% by mass to 70% by mass, and more preferably from 20% by mass to 60% by mass, with respect to the total amount of the buffer sheet composition. When the content of the inorganic filler is 5% by mass or more, an effect of reducing the thermal expansion coefficient tends to increase, and the moisture resistance reliability tends to improve. When the content of the inorganic filler is 70% by mass or less, there is a tendency that influences due to addition of the inorganic filler, such as a decrease in moldability of the resulting buffer film, and powder falling, can be reduced.

Further, in a case in which the buffer sheet composition contains the inorganic filler, the content of the inorganic filler is preferably from 1% by volume to 70% by volume, and more preferably from 5% by volume to 20% by volume, with respect to the total amount of the buffer sheet composition.

The content, on a volume basis, of the inorganic filler in the buffer sheet composition is measured as follows. First, a mass (Wc) of the buffer sheet composition at 25° C. is measured, and the buffer sheet composition is subjected to a heat treatment in air at 400° C. for 2 hours, and then at 700° C. for 3 hours to remove resin components by burning, followed by measuring a mass (Wf) of the remaining inorganic filler at 25° C. Next, a specific gravity (df) of the inorganic filler at 25° C. is obtained using an electronic specific gravity meter or a pycnometer. Subsequently, a specific gravity (dc) of the buffer sheet composition at 25° C. is measured in the same manner. Thereafter, a volume (Vc) of the buffer sheet composition and a volume (Vf) of the remaining inorganic filler are obtained, and then the volume of the remaining inorganic filler is divided by the volume of the buffer sheet composition as shown in (Formula 1), to obtain a volume ratio (Vr) of the inorganic filler.

$$Vc = Wc/dc$$

$$Vf = Wf/df$$

$$Vr = Vf/Vc \qquad \text{(Formula 1)}$$

Vc: volume of buffer sheet composition ($cm^3$)
Wc: mass of buffer sheet composition (g)
dc: density of buffer sheet composition ($g/cm^3$)
Vf: volume of inorganic filler ($cm^3$)

Wf: mass of inorganic filler (g)

df: density of inorganic filler (g/cm³)

Vr: volume ratio of inorganic filler (Curing Accelerator)

The buffer sheet composition in the present embodiment may contain at least one curing accelerator. Examples of the curing accelerator include phosphorus curing accelerators, amine curing accelerators, imidazole curing accelerators, and guanidine curing accelerators. Of these, phosphorus curing accelerators, amine curing accelerators, and imidazole curing accelerators are preferred. These curing accelerators can be used singly, or in combination of two or more kinds thereof.

In a case in which the buffer sheet composition contains the curing accelerator, a content of the curing accelerator is preferably, for example, from 0.05% by mass to 3% by mass, with respect to 100% by mass of a total amount of nonvolatile components in the epoxy resin and the curing agent.

(Solvent)

The buffer sheet composition in the present embodiment may contain at least one solvent. Examples of the solvent include methyl ethyl ketone, xylene, toluene, acetone, ethylene glycol monoethyl ether, cyclohexanone, ethyl ethoxypropionate, N,N-dimethylformamide, and N,N-dimethylacetamide. These solvents can be used singly, or in combination of two or more kinds thereof.

In a case in which the buffer sheet composition contains the solvent, a content of the solvent is not particularly limited. For example, the content of the solvent is preferably adjusted depending on a facility for producing the buffer sheet.

(Other Components)

The buffer sheet composition in the present embodiment may contain another component(s), if necessary. Examples of the other component include polymerization inhibitors, coupling agents, colorants, surfactants, and ion trapping agents.

<Buffer Sheet>

A buffer sheet in the present embodiment includes a thermosetting composition layer obtained by forming the buffer sheet composition in the present embodiment into a sheet. The buffer sheet may include a support on or above one surface or both surfaces of the buffer sheet.

When forming the buffer sheet composition into the form of a sheet, it is preferable to use the buffer sheet composition in the form of a varnish containing a solvent, from the viewpoint of workability. For example, the buffer sheet can be obtained by coating the varnish of the buffer sheet composition on or above a support, and drying the coating to form a composition layer. Since the buffer sheet is interposed between the electronic component(s) and the heating member, in the present embodiment, the buffer sheet preferably includes a support on or above both surfaces of the buffer sheet.

Examples of the support include: organic resin films, for example, polyolefin films such as polyethylene films and polyvinyl chloride films, polyethylene terephthalate films, polyethylene naphthalate films, polycarbonate films, and polyimide films; release papers; and metal foils such as copper foils and aluminum foils. The support may include a release layer. As the support, polyimide films, and metal foils such as copper foils and aluminum foils are preferred from the viewpoint of the heat resistance.

The coating of the varnish on or above the support can be carried out by a known method. Specific examples thereof include methods such as comma coating, die coating, lip coating and gravure coating.

The method of drying the varnish coated on or above the support is not particularly limited, as long as at least a part of the solvent contained in the varnish can be removed. The drying method can be selected as appropriate from commonly used drying methods. In addition to the drying method, a coating method may also be used in which a photoreaction by UV irradiation is carried out to provide coating properties.

The composition layer preferably has an average thickness of, for example, 20 μm or more, more preferably 50 μm or more, and still more preferably 100 μm or more, from the viewpoint of reducing the positional deviation in the surface direction between the electronic component and the substrate. Further, the composition layer preferably has an average thickness of, for example, 300 μm or less, and more preferably 200 μm or less, from the viewpoint of the film forming properties. The buffer sheet including the support(s) preferably has an average thickness of, for example, from 50 μm to 400 μm. The thickness of the composition layer or the buffer sheet can be measured using a micrometer or the like.

<Method of Producing Electronic Component Device>

The above described buffer sheet in present embodiment is interposed between a heating member and an electronic component, when the electronic component is heated by the heating member so as to mount the electronic component on a substrate, thereby producing an electronic component device. The method of producing an electronic component device using the buffer sheet in the present embodiment preferably includes a heating process in which, the electronic component is heated by the heating member through the buffer sheet, in a state where the electronic component and the substrate are in contact with each other with bumps being interposed therebetween, so that the electronic component and the substrate are joined together with the bumps being interposed therebetween.

In the present specification, the term "join" is used to mean that an electronic component and a substrate are electrically connected via bumps.

In a case in which a pre-applicable underfill material is used, it is preferable that the method of producing an electronic component device using the buffer sheet in the present embodiment further includes: an application process in which the underfill material is applied on at least one surface selected from the group consisting of the surface of the electronic component facing the substrate, and the surface of the substrate facing the electronic component; and a pressurizing process in which a pressure is applied to the electronic component and the substrate in a state where the electronic component and the substrate face each other with the bumps being interposed therebetween, so that the gap between the electronic component and the substrate is filled with the underfill material, and that the electronic component and the substrate are brought into contact with each other with the bumps being interposed therebetween.

In a conventional method of producing an electronic component device using a pre-applicable underfill material, the production of the device is carried out, for example, as follows. First, the underfill material is applied between an electronic component and a substrate, and a pressure is applied to the electronic component and the substrate in a state where the electronic component and the substrate face each other with bumps being interposed therebetween, so that the gap between the electronic component and the substrate is filled with the underfill material, and that the electronic component and the substrate are brought into contact with each other with the bumps being interposed therebetween. Subsequently, the electronic component is heated by a heating member, so that the electronic component and the substrate are joined together with the bumps being interposed therebetween, and that the underfill material is cured.

In the case of using such a conventional production method, there is a case in which a positional deviation occurs between the electronic component and the substrate before the underfill material is cured, when there is a difference in thermal expansion between the heating member, and the electronic component and the substrate. Further, when a plurality of electronic component devices are collectively produced, for example, an uneven load distribution during the heating may cause the occurrence of positional deviation, as a result of which the electronic components may be connected in a tilted state. The connection of the electronic component in such a positionally deviated or tilted state causes a connection failure in the resulting electronic component device. Even in a case in which the positional deviation is not so large as to cause a connection failure in the electronic component device, an inadequate connection form with insufficient connectivity may be a cause for a decreased reliability of the electronic component device.

In this regard, by using the buffer sheet in the present embodiment, it becomes possible to reduce the positional deviation between the electronic component and the substrate, as well as to collectively produce a plurality of electronic component devices.

A detailed description will be given below regarding an example of the method of producing an electronic component device in the case of using a pre-applicable underfill material.

(Application Process)

In the application process, the underfill material is applied on at least one surface selected from the group consisting of the surface of the electronic component facing the substrate, and the surface of the substrate facing the electronic component. A specific method of carrying out the application process is not particularly limited, and the underfill material may be applied on the surface of the substrate alone or on the surface of the electronic component alone, or alternatively, on both the surfaces. The method of applying the underfill material on the surface of the electronic component alone is preferred from the viewpoint of productivity.

The type of the substrate is not particularly limited. An example of the substrate may be, for example, a wiring board obtained by forming a conductor wiring including a connection electrode, on: an organic substrate including a fiber base material such as FR4 or FR5; a built-up organic substrate which does not include a fiber base material; an organic film such as a polyimide film or a polyester film; or a base material including an inorganic material such as ceramic, glass or silicon. A circuit, a substrate electrode and the like may be formed on the substrate, by a method such as a semi-active method or a subtractive method. Another example of the substrate may be, for example, a silicon wafer. The silicon wafer may be one in which a conductor wiring including a connection electrode is formed on the surface thereof. Further, the silicon wafer may be one including a through electrode (silicon through electrode; TSV (Through Silicon Via)).

A type of the electronic component is not particularly limited. The electronic component may be, for example, a die (chip) itself which is not packaged by a resin or the like, or a semiconductor package referred to as CSP, BGA (Ball Grid Array) etc., which is packaged by a resin or the like.

The electronic component may have a configuration in which a plurality of dies are arranged in a thickness direction, or a configuration in which a plurality of dies are connected via a through electrode (TSV) in the heating process. At this time, the underfill material may be applied on one surface or on both surfaces of the set of dies.

A material of the bumps is not particularly limited, and can be selected from commonly used materials such as solder and the like. The bumps may each be a combination of a metal post and a solder portion. From the viewpoint of environmental consideration and safety, a lead-free solder such as an Ag—Cu-based solder, a Sn—Cu-based solder, or a Sn—Bi-based solder may be used for the bumps, in addition to Cu or Au. The bumps may be formed on the side of the electronic component, or on the side of the substrate.

In a case in which the bumps are made of a lead-free solder, minute gaps are likely to be formed around the bumps, due to poor wettability of the lead-free solder. However, the use of the buffer sheet in the present embodiment enables to effectively reduce the occurrence of the positional deviation, even in a case in which the lead-free solder is used for forming the bumps.

As the underfill material, a commonly used underfill material can be used. Examples thereof include underfill materials disclosed in JP-A 2013-151642, JP-A 2013-219285, JP-A 2015-032637, JP-A 2015-032638, JP-A 2015-083633, and JP-A 2015-083634.

Since there is a tendency that a pitch between adjacent connecting portions are becoming increasingly narrower (having a narrower pitch), the underfill material is preferably a material which does not contain electrically conductive particles, from the viewpoint of ensuring the connection reliability.

A shape of the underfill material is not particularly limited, and the underfill material may be in the form of a film or liquid. From the viewpoint of reducing the positional deviation in the surface direction between the electronic component and the substrate in the pressurizing process, the underfill material is preferably in the form of a film.

The method of applying the underfill material on the electronic component or the substrate is not particularly limited.

In a case in which the underfill material is in the form of a liquid, examples of the application method include: a screen printing method; and a method which utilizes a dispenser such as an air dispenser, a jet dispenser or an Auger type dispenser.

In a case in which the underfill material is in the form of a film, examples of the application method include a method which utilizes a laminator employing a diaphragm system or a laminator employing a rolling system.

The shape of the underfill material when the underfill material is applied on the electronic component or the substrate is not particularly limited.

In a case in which the underfill material in the form of a liquid is applied on the substrate, it can be carried out, for example, by: a method in which the underfill material is applied over the entire area corresponding to a mounting position of the electronic component; a method in which the underfill material is applied in the shape of a cross consisting of two lines along the diagonals of a square which corresponds to the mounting position of the electronic component; a method in which the underfill material is applied in the shape of two crosses consisting of a first cross as described above, and a second cross which is shifted 45° from the first cross and overlaid thereon; or a method in which the underfill material is applied at one point in the center of the mounting position of the electronic component. In order to reduce a creeping of the underfill material or the like from the viewpoint of reliability, the underfill material is preferably applied in the shape of the first cross as described above, or in the shape of two crosses consisting of the first cross, and the second cross shifted 45° from the first cross and overlaid thereon. When the substrate is provided with a substrate electrode, the underfill material is preferably applied over the area of the mounting position of the electronic component, including the location where the substrate electrode is provided.

In a case in which the underfill material in the form of a film is applied on the electronic component or on the substrate, the underfill material is preferably applied over the entire area of the surface of the electronic component facing the substrate, or over the entire area of the mounting position of the electronic component, on the substrate.

A temperature at which the underfill material is applied on the substrate or the electronic component can be selected depending on the properties of the underfill material and the like. In a case in which the underfill material in the form of a film is applied on the electronic component by a laminator employing a diaphragm system, it is preferable that the temperatures of the underfill material and the surface of the electronic component are each adjusted to, for example, from 50° C. to 100° C. From the viewpoint of preventing a void entrainment during the lamination process, it is more preferable that the temperatures are each adjusted to from 70° C. to 90° C., and still more preferably around 80° C.

(Pressurizing Process)

In the pressurizing process, a pressure is applied to the electronic component and the substrate in a state where the electronic component and the substrate face each other with the bumps being interposed therebetween, so that the gap between the electronic component and the substrate is filled with the underfill material, and that the electronic component and the substrate are brought into contact with each other with the bumps being interposed therebetween.

A temperature of the underfill material in the pressurizing process (hereinafter, also referred to as "filling temperature") is preferably less than a curing temperature of the underfill material. For example, the filling temperature of the underfill material is preferably less than 200° C. When filling the gap between the electronic component and the substrate with the underfill material by application of a pressure, and when the filling temperature of the underfill material is adjusted to less than 200° C., there is a tendency that an increase in the viscosity of the underfill material can be prevented, the underfill material has sufficient fluidity, the connection is more easily secured, and the occurrence of voids can be avoided.

A lower limit of the filling temperature of the underfill material is not particularly limited. The filling temperature of the underfill material is preferably, for example, 30° C. or higher, more preferably 50° C. or higher, and still more preferably 80° C. or higher, from the viewpoint of decreasing the viscosity of the resin.

Specific method of adjusting the filling temperature of the underfill material is not particularly limited. Examples thereof include a method in which the temperature of at least one of the electronic component or the substrate is adjusted to the filling temperature, and then the electronic component and the substrate are brought into contact with the underfill material.

The magnitude of the pressure to be applied in the pressurizing process can be set in the same manner as in a mounting process of a common flip-chip, taking into consideration the number of bumps or variation in their heights, the amount of deformation, due to the pressure, of the bumps or the wiring on the substrate that receives the bumps, and the like. Specifically, the pressure is preferably set, for example, such that one piece of bump receives a load of about from 1 g to 10 g. Further, the pressure is preferably set, for example, such that the load applied to one piece of chip is about from 10 N to 100 N.

(Heating Process)

In the heating process, the electronic component is heated by the heating member through the buffer sheet, in a state where the electronic component and the substrate are in contact with each other with the bumps being interposed therebetween, so that the electronic component and the substrate are joined together with the bumps being interposed therebetween. In the heating process, the buffer sheet and the underfill material are cured.

The heating process may be a process in which the buffer sheet is first cured without curing the underfill material, followed by curing the underfill material.

The heating process is preferably carried out at a temperature equal to or higher than a melting point of the bumps, from the viewpoint of securing the connection between the electronic component and the substrate via the bumps. In other words, the heating process is preferably carried out at a temperature at which a metal junction is formed between each bump and the wiring and the like on the substrate. For example, in a case in which the bumps are solder bumps, the heating process is preferably carried out at a temperature of 230° C. or higher. From the viewpoint of the heat resistance of the buffer sheet and the underfill material, the heating process is preferably carried out, for example, at a temperature of 320° C. or lower, and more preferably at a temperature of 300° C. or lower.

The method of connection by solder joining has a high connection reliability, although it requires a higher temperature as compared to the connection method using electrically conductive particles, or the like. Accordingly, this method is also applicable in a case in which the number of the connecting portions is further increased, and in a case in which the pitch between adjacent connecting portions is further reduced. In order to realize a high-temperature mounting by such solder joining, the buffer sheet preferably has a heat resistance capable of withstanding the high-temperature mounting at a temperature of 200° C. or higher.

It is preferable that the temperature of the substrate and the temperature of the electronic component in the heating process are within the ranges of, for example, from 25° C. to 200° C. and from 230° C. to 300° C., respectively.

The numbers of the electronic components and the substrates in the heating process are not particularly limited. From the viewpoint of production efficiency, it is preferable that a plurality of the electronic components and the substrates are heated collectively. In a case in which a plurality of the electronic components and the substrates are heated collectively, it is preferable that one piece of buffer sheet is spread over the plurality of the electronic components. It is preferable that the numbers of the electronic components and the substrates to be heated collectively are each, for example, two or more, more preferably three or more, and still more preferably five or more. As the numbers of the electronic components and the substrates which are heated collectively increase, the effect provided by the production method using the buffer sheet in the present embodiment will be more pronounced.

It is preferable that the heating process is carried out within a short period of time, from the viewpoint of the production efficiency. Specifically, the heating process is preferably carried out at a temperature rise rate of, for example, 5° C./sec or more, more preferably at 10° C./sec or more, and still more preferably at 15° C./sec or more. From the viewpoint of the production efficiency, the heating process is preferably carried out for a shortest possible heating time, although the heating time varies depending on the type of material included in the bumps. In a case in which the bumps are solder bumps, the heating time is preferably, for example, 30 seconds or less, more preferably 20 seconds or less, and still more preferably 10 seconds or less. In the case of Cu—Cu or Cu—Au metal junction, the heating time is preferably, for example, 30 seconds or less.

From the viewpoint of reducing the positional deviation in the surface direction between the electronic component and the substrate during the heating process, it is preferable that the curing rate of the buffer sheet is higher than the curing rate of the underfill material. When the curing rates are adjusted such that the buffer sheet is cured faster than the underfill material, there is a tendency that the thermal expansion during the heating is further reduced, and the positional deviation is more easily reduced.

An example of the method of producing an electronic component device will be further described below, with reference to the drawings. In the production method described below, an embodiment will be described in which the underfill material is applied on the surface of the electronic component facing the substrate, the buffer sheet is provided to cover an upper portion of the electronic component, and the electronic component and the substrate are joined together. The bumps are provided on the side of the electronic component, and the electronic component and the substrate are joined together with the bumps being interposed therebetween. Further, in the heating process, three pieces each of the electronic components and the substrates are heated collectively. Note that, the method of producing an electronic component device using the buffer sheet is not limited to such an embodiment.

First, as shown in FIG. 1A, an underfill material 3 is applied on the surface of a semiconductor chip (electronic component) 1 on the side provided with solder bumps 2 (on the side facing connection pads 4 on a substrate 5) (application process).

Figure 1B:
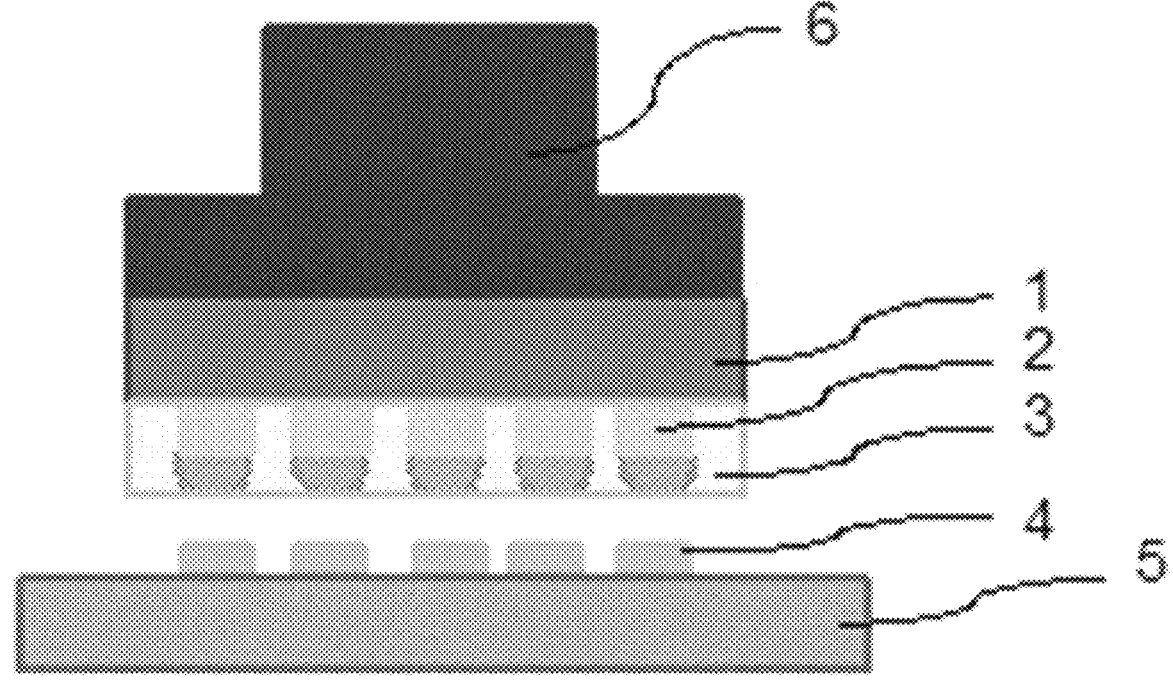
FIG. 1B is a schematic diagram illustrating the production process of the method of producing an electronic component device in the present embodiment.

Next, as shown in FIG. 1B, the semiconductor chip 1 and the substrate 5 are arranged so as to face each other with the solder bumps 2 being interposed therebetween. Then, a pressurizing member 6 is used to apply a pressure from above the semiconductor chip 1, so that the gap between the semiconductor chip 1 and the substrate 5 is filled with the underfill material 3, and that the semiconductor chip 1 and the connection pads 4 on the substrate 5 are brought into contact with the solder bumps 2 being interposed therebetween (pressurizing process).

Figure 1C:
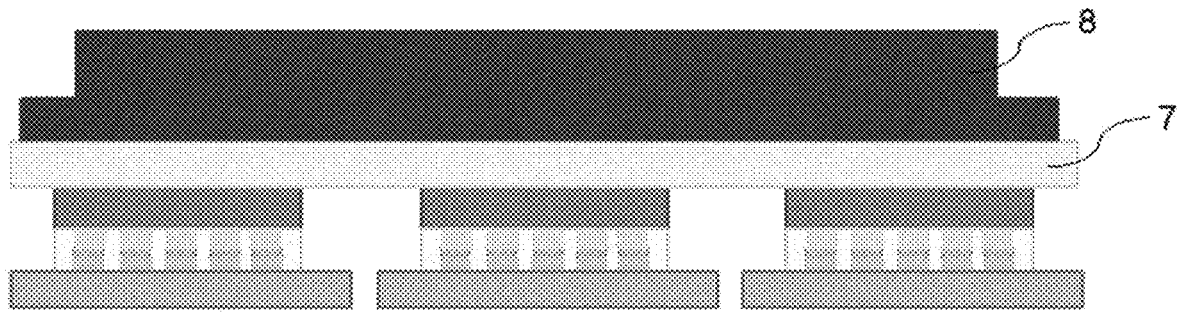
FIG. 1C is a schematic diagram illustrating the production process of the method of producing an electronic component device in the present embodiment.

Subsequently, as shown in FIG. 1C, a heating member 8 is pressed against the respective semiconductor chips 1 through the buffer sheet 7, in a state where each semiconductor chip 1 and the connection pads 4 on each substrate 5 are in contact with each other with the solder bumps 2 being interposed therebetween, so that each semiconductor chip 1 and the connection pads 4 on each substrate 5 are joined together with the solder bumps 2 being interposed therebetween, and that the buffer sheet 7 and each underfill material 3 are cured (heating process).

By carrying out the above described processes, electronic component devices are produced.

<Electronic Component Device>

The electronic component device produced by the above described production method is, for example, one in which a substrate, a cured product of an underfill material and an electronic component are arranged in this order, in which the substrate and the electronic component are joined together with the bumps being interposed therebetween, and in which the gap between the substrate and the electronic component is filled with the cured product of the underfill material. Such an electronic component device has a small positional deviation in the surface direction between the electronic component and the substrate, and has an excellent reliability.

The effect of the production method using the buffer sheet in the present embodiment is markedly exhibited, particularly in the case of producing an electronic component device in which the distance between the electronic component and the substrate, and the distance between the bumps, are short. Specifically, the average distance between the electronic component and the substrate in the electronic component device is preferably, for example, 50 μm or less, more preferably 40 μm or less, and still more preferably 30 μm or less. Further, the average distance between the bumps in the electronic component device is preferably, for example, 200 μm or less, more preferably 150 μm or less, still more preferably 100 μm or less, and particularly preferably 80 μm or less.

The substrate in the electronic component device may include an uneven portion due to a wiring pattern and a resist pattern. In a case in which the substrate includes a wiring pattern and a resist pattern, it is preferable, for example, that the average width of the wiring pattern is from 50 μm to 300 μm, the average width of openings of the resist is from 50 μm to 150 μm, and the average thickness of the resist has from 10 μm to 20 μm. According to the production method using the buffer sheet in the present embodiment, it is possible to reduce the positional deviation in the surface direction between the electronic component and the substrate, even in the case of using a substrate including an uneven portion as described above.

EXAMPLES

The present invention will now be more specifically described by way of Examples. However, the present invention is in no way limited to these Examples.

Synthesis Example 1

A thermoplastic resin is synthesized as follows.

Into a flask equipped with an agitator, a reflux condenser, a thermometer, a dropping funnel, and a nitrogen gas introduction pipe, 400 g of a blend of methyl cellosolve and toluene (methyl cellosolve:toluene=6:4 (mass ratio)) was introduced, and the flask was stirred while blowing nitrogen gas thereinto, and heated to 80° C. In the meantime, a "solution a" was prepared by mixing 125 g of methacrylic acid, 25 g of methyl methacrylate, 125 g of benzyl methacrylate, and 225 g of styrene, as polymerizable monomers, and 1.5 g of azobisisobutyronitrile. The thus prepared solution a was added dropwise over four hours, to the above described blend of methyl cellosolve and toluene which had been heated to 80° C., and then the resultant was maintained at 80° C. for two hours, while stirring. Further, a solution obtained by dissolving 1.2 g of azobisisobutyronitrile in 100 g of a blend of methyl cellosolve and toluene (methyl cellosolve:toluene=6:4 (mass ratio)) was added dropwise into the flask over 10 minutes. The solution after the completion of the dropping was maintained at 80° C. for three hours while stirring, followed by heating to 90° C. over 30 minutes. After maintaining at 90° C. for two hours, the resultant was cooled to obtain a thermoplastic resin. The resulting thermoplastic resin contained 46.2% by mass of nonvolatile components (solids content), and had a weight average molecular weight of 45,000.

Examples 1 and 2

<Production of Buffer Sheet>

Into a flask equipped with an agitator, 58 g of the thermoplastic resin obtained in Synthesis Example 1, and 42 g of trimethylolpropane triacrylate (trade name "TMPT21"; manufactured by Hitachi Chemical Co., Ltd.) as a thermo-setting compound were introduced. Thereafter, 2 g of 1,1-bis(t-butylperoxy)cyclohexane (trade name "PERHEXA C"; manufactured by Nippon Oils & Fats Co., Ltd.,) as a thermal polymerization initiator was further added to the flask, followed by stirring, to obtain a varnish.

The resulting varnish was coated on a belt surface side of a polyimide film (trade name "CAPTON 100H", average thickness: 25 μm; manufactured by Du Pont-Toray Co., Ltd.), followed by drying in a dryer controlled at 60° C. for 10 minutes, to obtain a sheet including a composition layer having an average thickness of 70 μm or 100 μm. On the side of each resulting sheet provided with the composition layer, a polyimide film (trade name "CAPTON 100H", average thickness: 25 μm; manufactured by Du Pont-Toray Co., Ltd.) was layered such that the belt surface thereof faces the side of the composition layer, and the resultant was laminated under the conditions of 60° C., 0.5 MPa, and 1.0 m/min, using a hot roll laminator, to obtain a buffer sheet A (average thickness: 120 μm) and a buffer sheet B (average thickness: 150 μm) each including the thermosetting composition layer.

<Production of Electronic Component Device>

As materials for an electronic component device, a silicon chip (trade name "WALTS-TEG CC80-0101JY-MODEL 1", bumps: Sn—Ag—Cu-based bumps, bump interval: 80 μm; manufactured by WALTS Co., Ltd.) having a size of 7.3 mm×7.3 mm×0.1 mm and having an aluminum wiring was prepared as an electronic component, and a substrate (trade name "WALTS-KIT CC80-0102JY-MODEL 1", solder resist: PSR4000-AUS703, base material: E679FGS; manu-factured by WALTS Co., Ltd.) having a size of 18 mm×18 mm×0.4 mm and provided with a circuit was prepared as a substrate.

An underfill material in the form of a film (epoxy-based NCF (Non-conductive Film); manufactured by Hitachi Chemical Co., Ltd.) was laminated on the electronic com-ponent whose temperature had been adjusted to 80° C., using a vacuum laminator (trade name "V130"; manufac-tured by Nichigo-Morton Co., Ltd.) employing a diaphragm system (application process).

Subsequently, the silicon chip laminated with the underfill material whose filling temperature had been adjusted to 80° C., was arranged such that the surface thereof provided with the bumps faces the side of the substrate, and a pressure was applied from above the silicon chip at a load of 120 N, by a pressurizing member, so that the bumps are brought into contact with the substrate (pressurizing process). Whereby, the underfill material applied on the silicon chip was fluid-ized due to the applied pressure, and filled the gap between the substrate and the silicon chip. In this manner, an elec-tronic component-mounted substrate was produced.

Five pieces of the electronic component-mounted sub-strates obtained as described above were placed such that the substrates are positioned at four corners and the center of a 10 cm square, with the sides of the silicon chips facing upward. The buffer sheet A or the buffer sheet B obtained as described above was placed on top of the five pieces of silicon chips so as to cover the surfaces thereof. Then a heating member which had been preheated to 160° C. in advance and held at a 50 μm-tilted position was brought into contact with the silicon chips through the buffer sheet at a load of 600 N. The heating member was then heated to 260° C. over the next 10 seconds, and maintained at 260° C. for 15 seconds after reaching the temperature, thereby allowing the silicon chips and the substrates to be joined together (heating process). In this manner, five pieces of the elec-tronic component devices were produced collectively.

For each of the electronic component devices obtained as described above, an observation of delamination, confirma-tion of connectivity, and examination of the positional deviation between the silicon chip and the substrate were carried out as follows. The evaluation results are shown in Table 1.

<Observation of Delamination>

The observation of delamination was carried out by observing the interior of each of the electronic component devices after being subjected to the heating process, using an ultrasonic observation apparatus (trade name "INSIGHT-300"; manufactured by Insight K.K.), and the evaluation of delamination was carried out according to the following evaluation criteria.

—Evaluation Criteria—

A: No delamination was observed in all of the electronic components after the heating.

B: Delamination was observed in some of the electronic components after the pre-heating.

<Confirmation of Connectivity>

The confirmation of connectivity was carried out by confirming the conduction of each of the electronic compo-nent devices after being subjected to the heating process, using a tester (trade name "SK-6500"; manufactured by Kaise Corporation), and the evaluation of connectivity was carried out according to the following evaluation criteria.

—Evaluation Criteria—

A: Conduction was confirmed in all of the electronic components after heating.

B: Conduction was not confirmed in some of the elec-tronic components after heating.

<Examination of Positional Deviation Between Silicon Chip and Substrate>

The examination of the positional deviation was carried out by measuring the positional deviation in the surface direction between the solder bumps on the silicon chip and the connection pad portions of the substrate, in each of the electronic component devices after being subjected to the heating process, using an X-ray observation apparatus (trade name "XD-7600 NT100-CT; manufactured by Nordson Advanced Technology K. K.), and the evaluation of the positional deviation was carried out according to the fol-lowing evaluation criteria. Note that the positional deviation was determined by performing the measurement at five locations in each device, and calculating the arithmetic mean value of the measured values.

—Evaluation Criteria—

A: The average positional deviation in the surface direc-tion between the silicon chips and the connection pad portions of the substrates is less than 7 μm.

B: The average positional deviation in the surface direction between the silicon chips and the connection pad portions of the substrates is 7 μm or more but less than 10 μm.

C: The average positional deviation in the surface direction between the silicon chips and the connection pad portions of the substrates is 10 μm or more.

Example 3

<Production of Buffer Sheet>

Into a flask equipped with an agitator, 98.32 g of trimethylolpropane triacrylate (trade name "TMPT21"; manufactured by Hitachi Chemical Co., Ltd.) as a thermosetting compound was introduced. Thereafter, 0.15 g of 2-hydroxy-2-methyl-1-phenyl-propan-1-one (trade name "IRGACURE 1173"; manufactured by BASF Japan Ltd.) as a photopolymerization initiator, and 1.5 g of 1,1-bis(t-butylperoxy) cyclohexane (trade name "PERHEXA C"; manufactured by Nippon Oils & Fats Co., Ltd.) as a thermal polymerization initiator were further added to the flask, followed by stirring, to obtain a varnish.

The resulting varnish was coated on the belt surface side of a polyimide film (trade name "CAPTON 100H", average thickness: 25 μm; manufactured by Du Pont-Toray Co., Ltd.), followed by irradiation of UV light at a light exposure of 200 mJ, using an UV light exposure apparatus, to obtain a sheet including a composition layer having an average thickness of 100 μm. On the side of the resulting sheet provided with the composition layer, a polyimide film (trade name "CAPTON 100H", average thickness: 25 μm; manufactured by Du Pont-Toray Co., Ltd.) was layered such that the belt surface thereof faces the side of the composition layer, and the resultant was laminated under the conditions of 60° C., 0.5 MPa, and 1.0 m/min, using a hot roll laminator, to obtain a buffer sheet C (average thickness: 150 μm) including the thermosetting composition layer.

<Production of Electronic Component Device>

The same procedure as in Example 1 was repeated except that the buffer sheet C was used instead of the buffer sheet A, and that the tilt of the heating member was set as shown in Table 1, in the heating process, to produce electronic component-mounted substrates, and then to produce electronic component devices, of Example 3. Subsequently, for each of the resulting electronic component devices, the observation of delamination, the confirmation of connectivity, and the examination of the positional deviation between the silicon chip and the substrate were carried out, and the evaluations thereof were performed, in the same manner as in Example 1. The evaluation results are shown in Table 1.

Example 4

<Production of Buffer Sheet>

To the varnish prepared in Example 3, 20 g of silica particles (trade name "FB-5SDCH", volume average particle size: 5.0 μm; manufactured by Denki Kagaku Kogyo K.K.) as an inorganic filler were added, followed by stirring, to obtain a varnish. Thereafter, the same procedure as in Example 3 was repeated except for using the thus obtained varnish, to obtain a buffer sheet D (thickness: 150 μm) including a thermosetting composition layer.

<Production of Electronic Component Device>

The same procedure as in Example 1 was repeated except that the thermosetting sheet D was used instead of the thermosetting sheet A, and that the tilt of the heating member was set as shown in Table 1, in the heating process, to produce electronic component-mounted substrates, and then to produce electronic component devices, of Example 3. Subsequently, for each of the resulting electronic component devices, the observation of delamination, the confirmation of connectivity, and the examination of the positional deviation between the silicon chip and the substrate were carried out, and the evaluations thereof were performed, in the same manner as in Example 1. The evaluation results are shown in Table 1.

Comparative Examples 1 and 2

The same procedure as in Example 1 was repeated except that no buffer sheet was used, and that the tilt of the heating member was set as shown in Table 1, in the heating process, to produce electronic component-mounted substrates, and then to produce electronic component devices, of Comparative Examples 1 and 2. Subsequently, for each of the resulting electronic component devices, the observation of delamination, the confirmation of connectivity, and the examination of the positional deviation between the silicon chip and the substrate were carried out, and the evaluations thereof were performed, in the same manner as in Example 1. The evaluation results are shown in Table 1.

Comparative Example 3

The same procedure as in Example 1 was repeated except that an aluminum foil (average thickness: 45 μm) was used instead of the buffer sheet A, and that the tilt of the heating member was set as shown in Table 1, in the heating process, to produce electronic component-mounted substrates, and then to produce electronic component devices, of Comparative Example 3. Subsequently, for each of the resulting electronic component devices, the observation of delamination, the confirmation of connectivity, and the examination of the positional deviation between the silicon chip and the substrate were carried out, and the evaluations thereof were performed, in the same manner as in Example 1. The evaluation results are shown in Table 1

TABLE 1

| | Example 1 | Example 2 | Example 3 | Example 4 | Comparative Example 1 | Comparative Example 2 | Comparative Example 3 |
|---|---|---|---|---|---|---|---|
| Buffer sheet | A | B | C | D | Not provided | Not provided | Aluminum foil |
| Average thickness of buffer sheet (μm) | 120 | 150 | 150 | 150 | — | — | 45 |
| Tilt of heating member (μm) | 50 | 50 | 0 | 0 | 0 | 50 | 0 |
| Load applied in pressurizing process (N) | | | | 120 | | | |
| Temperature in pressurizing process (° C.) | | | | 80 | | | |

TABLE 1-continued

|  | Example 1 | Example 2 | Example 3 | Example 4 | Comparative Example 1 | Comparative Example 2 | Comparative Example 3 |
|---|---|---|---|---|---|---|---|
| Load applied in heating process (N) |  |  |  | 600 |  |  |  |
| Temperature in heating process (° C.) |  |  |  | 260 |  |  |  |
| Results of observation of delamination | A | A | A | A | A | B | B |
| Results of confirmation of connectivity | A | A | A | A | A | B | B |
| Results of examination of positional deviation | A | A | A | A | C | C | C |

As can be clearly seen from the results shown in Table 1, the use of the buffer sheet including the thermosetting composition layer allows for reducing the positional deviation between the electronic component and the substrate, as well as producing a plurality of electronic component devices collectively. Further, the electronic component device produced using the buffer sheet including the thermosetting composition layer is less susceptible to delamination, and has an excellent connectivity and reliability.

Meanwhile, the entire contents of the disclosures of Japanese Patent Application No. 2015-169048 filed on Aug. 28, 2015 are incorporated herein by reference.

Further, all the literature, patent application, and technical standards cited herein are also herein incorporated to the same extent as provided for specifically and severally with respect to an individual literature, patent application, and technical standard to the effect that the same should be so incorporated by reference.

EXPLANATION OF REFERENCES

1 Semiconductor chip (electronic component)
2 Solder bump
3 Underfill material
4 Connection pad
5 Substrate
6 Pressurizing member
7 Buffer sheet
8 Heating member

The invention claimed is:

1. A method of producing an electronic component device, the method comprising:
 providing an electronic component and a substrate, wherein the electronic component has a surface facing the substrate, the substrate has a surface facing the electronic component, and solder bumps are formed on one of said surfaces;
 applying a curable underfill material to one or both of the electronic component surface facing the substrate and the substrate surface facing the electronic component;
 applying pressure to the electronic component and the substrate with the solder bumps interposed between the electronic component and the substrate, so that a gap between the electronic component and the substrate is filled with the curable underfill material;
 providing a buffer sheet comprising a dried layer of a curable thermosetting composition, wherein the curable thermosetting composition comprises at least one thermosetting compound;

interposing the buffer sheet between a heating member and the electronic component; and
subsequently curing the dried layer of the buffer sheet and the curable underfill material with heat from the heating member.

2. The method according to claim 1, wherein the at least one thermosetting compound comprises an epoxy resin.

3. The method according to claim 1, wherein the curable thermosetting composition further comprises one or more elements selected from the group consisting of a curing agent, an inorganic filler, a curing accelerator, and a solvent.

4. The method according to claim 1, wherein the at least one thermosetting compound comprises a (meth)acrylate compound and the (meth)acrylate compound is selected from the group consisting of erythritol-type poly (meth) acrylate compounds, glycidyl ether-type (meth)acrylate compounds, bisphenol A-type di(meth)acrylate compounds, cyclodecane-type di(meth)acrylate compounds, methylol-type (meth)acrylate compounds, dioxane-type di(meth)acrylate compounds, bisphenol F-type (meth)acrylate compounds, dimethylol-type (meth)acrylate compounds, isocyanuric acid-type di(meth)acrylate compounds, and trimethylol-type tri(meth)acrylate compounds.

5. The method according to claim 1, wherein the curable thermosetting composition further comprises a thermoplastic resin.

6. The method according to claim 5, wherein the thermoplastic resin is selected from the group consisting of acrylic resins, styrene resins, butadiene resins, imide resins, and amide resins.

7. The method according to claim 1, wherein the at least one thermosetting compound comprises trimethylolpropane triacrylate.

8. The method according to claim 1, wherein the curable thermosetting composition further comprises a polymerization initiator.

9. The method according to claim 1, wherein the curable thermosetting composition further comprises a curing agent.

10. The method according to claim 1, wherein the buffer sheet further comprises a support provided on or above one surface of the dried layer or the buffer sheet further comprises supports provided on both surfaces of the dried layer.

11. The method according to claim 1, wherein the dried layer of the buffer sheet has an average thickness of 20 μm or more.

* * * * *